United States Patent
Tseng et al.

(10) Patent No.: US 7,459,371 B2
(45) Date of Patent: Dec. 2, 2008

(54) METHOD FOR NON-VOLATILE MEMORY FABRICATION

(75) Inventors: Tseung-Yuen Tseng, Hsinchu (TW); Chih-Yi Liu, Tainan County (TW); Chun-Chieh Chuang, Tainan (TW)

(73) Assignee: Winbond Electronics Corp., Hsinchu (TW)

( * ) Notice: Subject to any disclaimer, the term of this patent is extended or adjusted under 35 U.S.C. 154(b) by 345 days.

(21) Appl. No.: 11/293,279

(22) Filed: Dec. 5, 2005

(65) Prior Publication Data

US 2006/0286762 A1    Dec. 21, 2006

(30) Foreign Application Priority Data

Jun. 15, 2005    (TW) ............................... 94119818 A

(51) Int. Cl.
*H01L 21/20* (2006.01)
*H01L 21/8242* (2006.01)

(52) U.S. Cl. ...................... 438/382; 438/239; 438/240; 257/516; 257/E21.008; 257/E21.664

(58) Field of Classification Search ................ 438/382, 438/239, 240; 257/E21.008, E21.664, 516
See application file for complete search history.

(56) References Cited

U.S. PATENT DOCUMENTS

| | | | |
|---|---|---|---|
| 6,445,024 B1 * | 9/2002 | Kwon et al. | 257/295 |
| 6,965,137 B2 * | 11/2005 | Kinney et al. | 257/295 |
| 2002/0154554 A1 * | 10/2002 | Higuchi et al. | 365/200 |
| 2003/0157250 A1 * | 8/2003 | Mukherjee et al. | 427/337 |

OTHER PUBLICATIONS

R.Wurm, O.Dernovsek and P.Greil "Sol-Gel derived SrTiO3 and SrZrO3 coatings on SiC and C-fibers", Journal of Materials Sciecne 34 (1999), pp. 4031-4037.*

Y.K.Lu, C.H.Chen, W.Zhu, T.Yu and X.F.Chen Structural and Electrical Properties of SrZrO3 Thin Films on Different Pt bottom electrodes, Ceramics International 30 (2004), pp. 1547-1551.*

* cited by examiner

*Primary Examiner*—Douglas M Menz
*Assistant Examiner*—Julia Slutsker
(74) *Attorney, Agent, or Firm*—Muncy, Geissler, Olds & Lowe, PLLC

(57) ABSTRACT

A method for non-volatile memory fabrication is provided, in which a substrate is provided, a bottom electrode is formed on the substrate, a solution with precursors of Zr and Sr is coated on the bottom electrode, the solution on the bottom electrode surface is dried and then fired to form a resistor layer of $SrZrO_3$, and a top electrode is formed on the resistor layer.

23 Claims, 4 Drawing Sheets

METHOD FOR NON-VOLATILE MEMORY FABRICATION

BACKGROUND

The present invention relates to non-volatile memory fabrication, and more particularly, to a method for resistor-type non-volatile memory fabrication.

Memory devices are typically divided into volatile and non-volatile types. Among non-volatile memory devices, flash memory is the most popular. As semiconductor size is reduced, flash memory devices face challenges of high operating voltage, long operating time, and gate oxide thinning, causing unsatisfactory retention time. Thus, newer non-volatile memory types have been developed to replace flash memories, among which, resistive non-volatile memory provides higher write and erase speeds, low operating voltage, low operating current, long retention time, simple structure, low power consumption, small size, and low cost.

FIG. 1 is a schematic diagram of a conventional resistor-type non-volatile memory 10, disposed on a substrate 12, comprising a dielectric layer 14, a bottom electrode 16, a resistor layer 18, and a top electrode 20. The bottom electrode 16 comprises a platinum film. The resistor layer 18 comprises a chromium (Cr) doped strontium titanate single crystal and provides reversible resistance switching.

FIG. 2 shows a relationship between bias and leakage currents of a conventional non-volatile memory 10. As shown, when the bias voltage applied on the resistive non-volatile memory 10 increases positively from 0 V, the leakage current increases along curve C1. However, when the positive bias exceeds V1, the relationship between the bias and leakage current switches to the curve C2. At that time, leakage current reduces. The relationship follows the curve C2, even if the bias is again reduced. Until a negative bias less than V2 is applied to the resistive non-volatile memory 10, the relationship between the bias and the leakage current switches back to curve C1 along with an increased negatively leakage current, such that resistance of the resistive non-volatile memory 10 is reduced. Because of the special characteristics of resistance switching, the resistive non-volatile memory can be used as a memory. For example, these two different resistances can be used to represent 0 and 1, respectively. When write or erase is required in the memory device, they can easily be implemented by applying proper voltage to the resistive non-volatile memory 10 to change resistance. In addition, data stored therein is retained without requiring power supply.

In conventional fabrication of resistive layer 18, two methods are typically used. In one, a single crystal structure of $SrTiO_3$ is formed with a crystal orientation (100) and then undergoes flame fusion to form a Cr doped $SrTiO_3$ single crystal. Alternatively, a pulse laser sputtering process can be used to grow a Cr doped $SrZrO_3$ film. However, the single crystal structure incurs higher costs, while the latter method is not suitable to form a large area uniform composition film, such that neither method meets requirements of mass production.

Thus, an improved method for non-volatile memory fabrication is called for.

SUMMARY

A method for fabricating a non-volatile memory is disclosed, in which a substrate is provided, a bottom electrode is formed on the substrate, a solution with precursors of Zr and Sr is coated on the bottom electrode, drying is performed on the solution on the bottom electrode surface and then fired the dried film to form a resistor layer of $SrZrO_3$, and a top electrode is formed on the resistor layer.

DESCRIPTION OF THE DRAWINGS

The invention can be more fully understood by reading the subsequent detailed description in conjunction with the examples and references made to the accompanying drawings, wherein.

DETAILED DESCRIPTION

Figure 1:
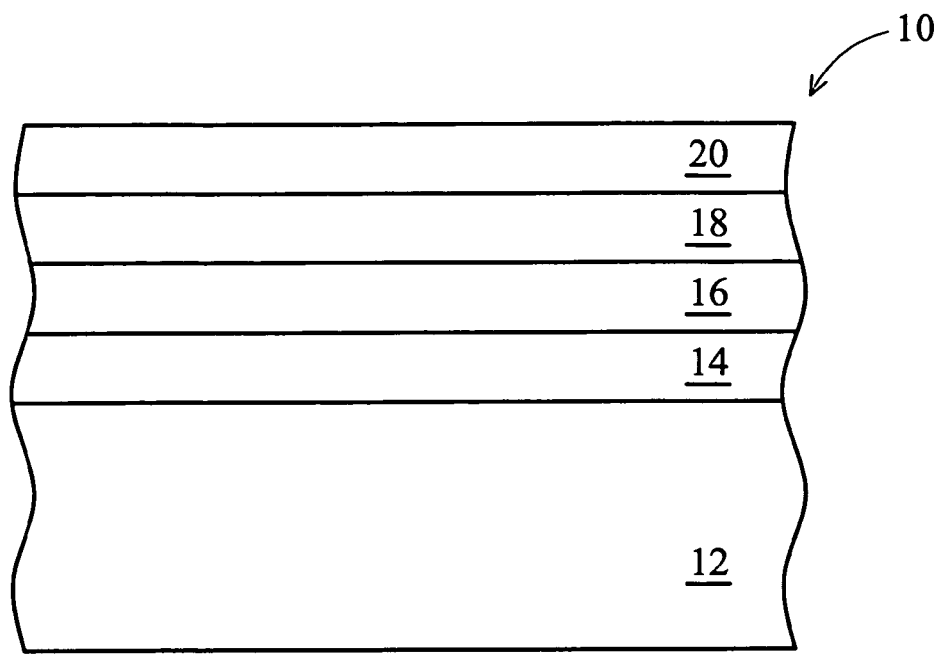
FIG. 1 is a schematic diagram of a conventional resistor-type non-volatile memory.
Figure 2:
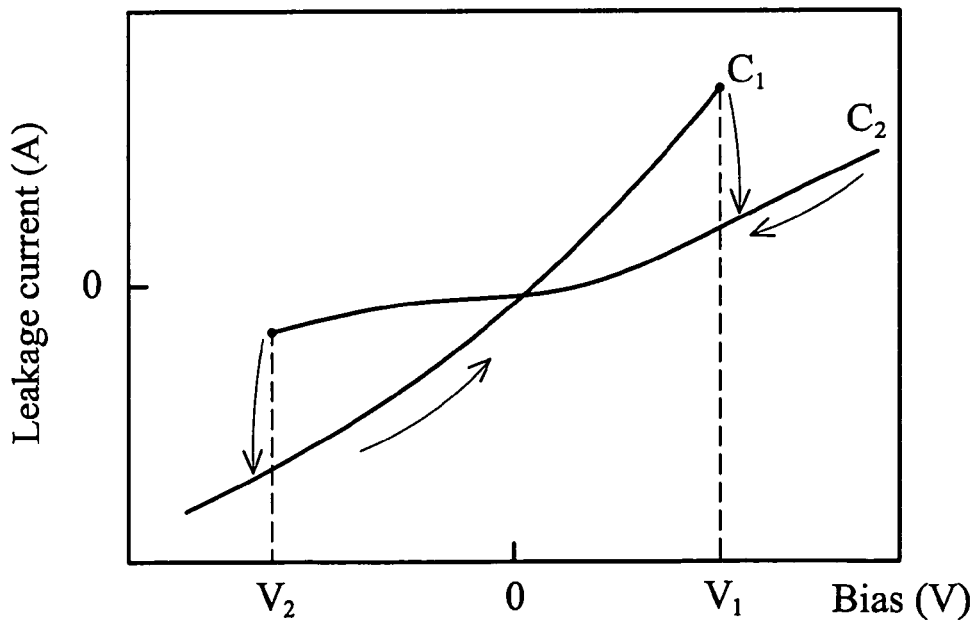
FIG. 2 shows the relationship between a bias and leakage current of a conventional non-volatile memory.
Figure 3:
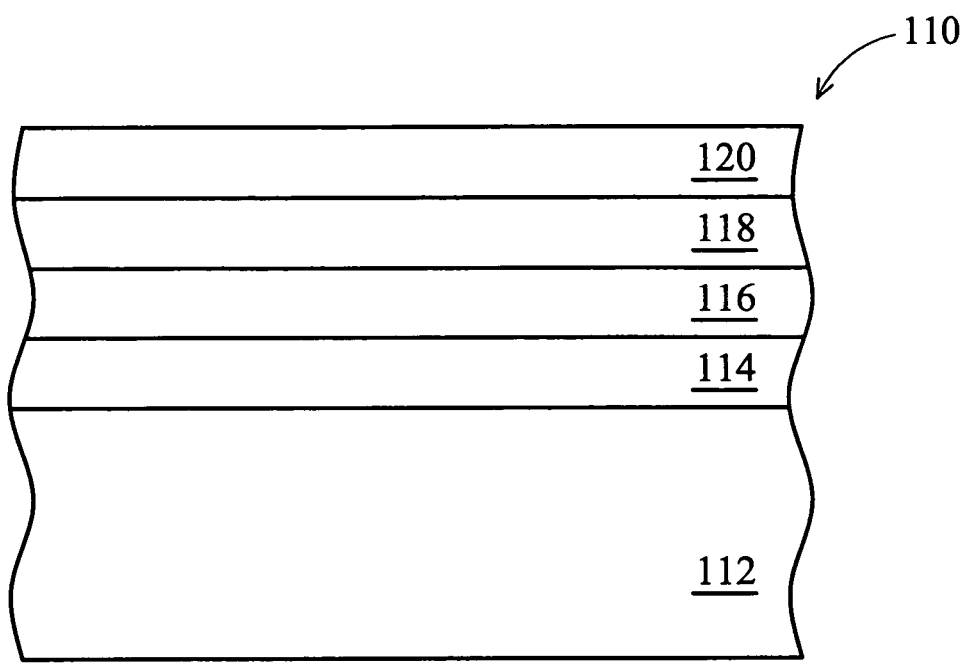
FIG. 3 is a cross-section of a first embodiment of a resistive non-volatile memory according to the invention.

FIG. 3 is a cross-section of a first embodiment of a resistive non-volatile memory 110. The memory 110 comprises a substrate 112, a dielectric layer 114, a bottom electrode 116, a resistor layer 118, and a top electrode 120 stacked in sequence.

In an embodiment of the memory, the substrate 112 is a silicon substrate, and dielectric layer 114 comprises a silicon oxide layer at a thickness of 100 to 500 nm. The bottom electrode 116 comprises a $LaNiO_3$ film of (100) or (200) preferred orientation at a thickness of about 10 to 1000 nm. The resistor layer 118 comprises $SrZrO_3$ film doped with dopants comprising V, Fe, Nb, Mn, Cr, Mo, or combinations thereof, with concentration of dopants between about 0.05 to 1 mol %. Thickness of the resistor layer 118 is about 20 to 500 nm. The top electrode 120 comprises an aluminum film.

In an embodiment of a method of fabricating a non-volatile memory 110, a substrate 112, such as a silicon substrate, is first provided and then cleaned by standard Radio Corporation of America (RCA) process. After cleaning, a silicon oxide layer is thermally grown on the substrates 112 as the dielectric layer 114 to isolate leakage current from the substrate 112. The thickness of the silicon dioxide is about 100 to 500 nm. In one embodiment, the thickness of the silicon dioxide can be 200 nm.

Radio-frequency (RF) magnetron sputtering is performed to form a $LaNiO_3$ film on the dielectric layer 114 as the bottom electrode 116. In the radio-frequency magnetron sputtering process, the $LaNiO_3$ film is grown at 300° C. Plasma power density is about 23.3 W/cm², with working pressure 40 mTorr and air flow rate 40 sccm. The ratio between Ar and $O_2$ is 6:4. Note that the formed $LaNiO_3$ film has a preferred orientation structure, such as (100) or (200). In addition, this crystal orientation can remain after sequent thermal processes to ensure stability of the bottom electrode 116. The thickness of the $LaNiO_3$ film is about 10 to 1000 nm. In one embodiment, the thickness of the $LaNiO_3$ film can be 100 nm.

A resistor layer of SrZrO₃ is formed on the LaNiO₃ film by sol-gel method. A solution with precursors of Zr and Sr is coated on the bottom electrode 116, and then the solution on the bottom electrode 116 surface is dried to form a resistor layer of SrZrO₃.

Figure 7:
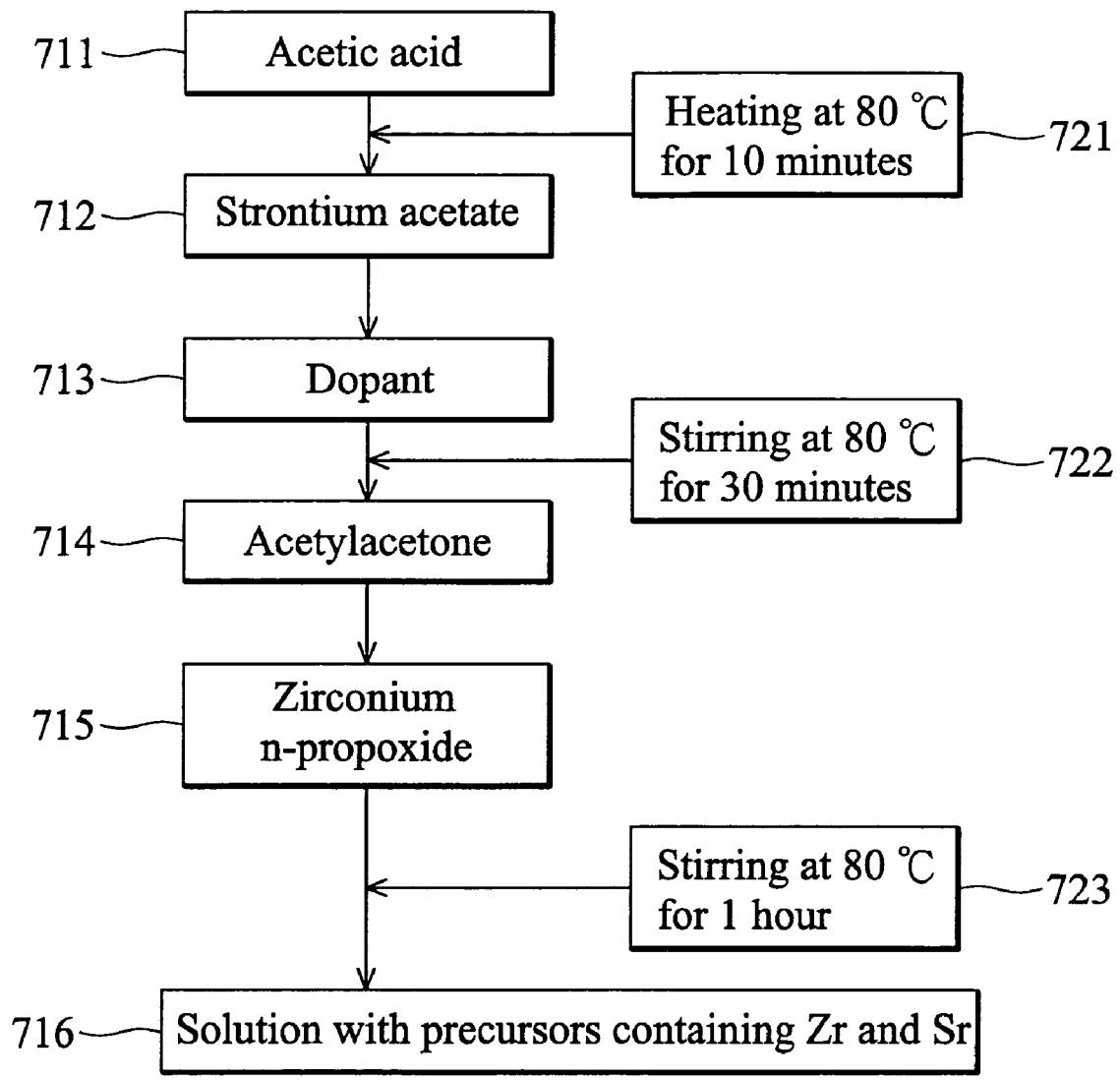
FIG. 7 shows preparation of a sol-gel solution with precursors of Zr and Sr according to an embodiment of the invention.

FIG. 7 shows preparation of the sol-gel solution with precursors of Zr and Sr, comprising providing an acetic acid ($CH_3COOH$) solvent in a container in step 711, heating the container at 80° C. for 10 minutes to evaporate the water from the acetic acid solvent in step 721, adding strontium acetate ($Sr(CH_3CO_2)_2$) and dopant to the container for mixing with acetic acid in step 712 and 713, stirring and heating the solution at 80° C. for 30 minutes in step 722, adding acetylacetone ($C_5H_8O_2$) and zirconium n-propoxide to the container in step 714 and 715, and stirring and heating the solution at 80° C. for 60 minutes to full react the mixtures in step 723. A solution with precursors of Zr and Sr is prepared in step 716.

The ratio of acetic acid (in step 711) to acetylacetone (in step 714) can be any value. For example, a preferred volume ratio of acetic acid to acetylacetone can be 1:1. The dopant in step 713 comprises V, Fe, Nb, Mn, Cr, Mo, or combinations thereof, a concentration about 0.05 to 1 mol %. In an embodiment, the dopants can be V of 0.2 mol % and Mn of 0.1 mol %. The solvent in step 711 can be acetic acid, propionic acid ($C_2H_5COOH$) or butyric acid ($C_3H_7COOH$). The solvent in step 714 can be acetylacetone, while other chemicals, such as ethylene glycol, isopropyl alcohol, or n-propyl alcohol can also be used.

Steps 721, 722, and 723 can be performed, but are not limited to, at 80° C. with stirring for 10 minutes, 80° C. for 30 minutes, and 80° C. for 60 minutes, respectively, at between 60 and 120° C., with stirring time between 1 minute and 24 hours depending on application. In an embodiment, the container can be heated at 60 to 120° C. for 1 minute to 12 hours to evaporate the water from the acetic acid solvent in step 721, 10 minutes to 12 hours for a dissolution of strontium acetate and dopants in step 722, and 10 minutes to 24 hours for full reaction of the mixtures in step 723.

Moreover, the sequence of steps 711-715 and 721-723 can also be rearranged for the preparation of the solution.

Processes in FIG. 7 can be open to air, and precursor concentration within prepared solution can reach about 0.3M in this environment. However, precursors can reach higher concentration in an environment $N_2$, He, or other inert gases.

After the solution with precursors of Zr and Sr is prepared, the solution is coated on the bottom electrode 116, the coated film on the bottom electrode 116 is heated in high-temperature furnace to evaporate solvents from the solution and the films are crystallized into SrZrO₃. Temperature of the high-temperature furnace is between about 300 and 800° C. Thickness of the SrZrO₃ film is between about 20 and 500 nm depending on precursor concentration and number of coatings. In an embodiment, thickness of the SrZrO₃ film between about 25 to 50 nm is preferred. Al film of about 300 nm is formed on the resistor layer 118 by thermal evaporation, and a mask is used to define the pattern of the Al film to form top electrode 120.

Figure 4:
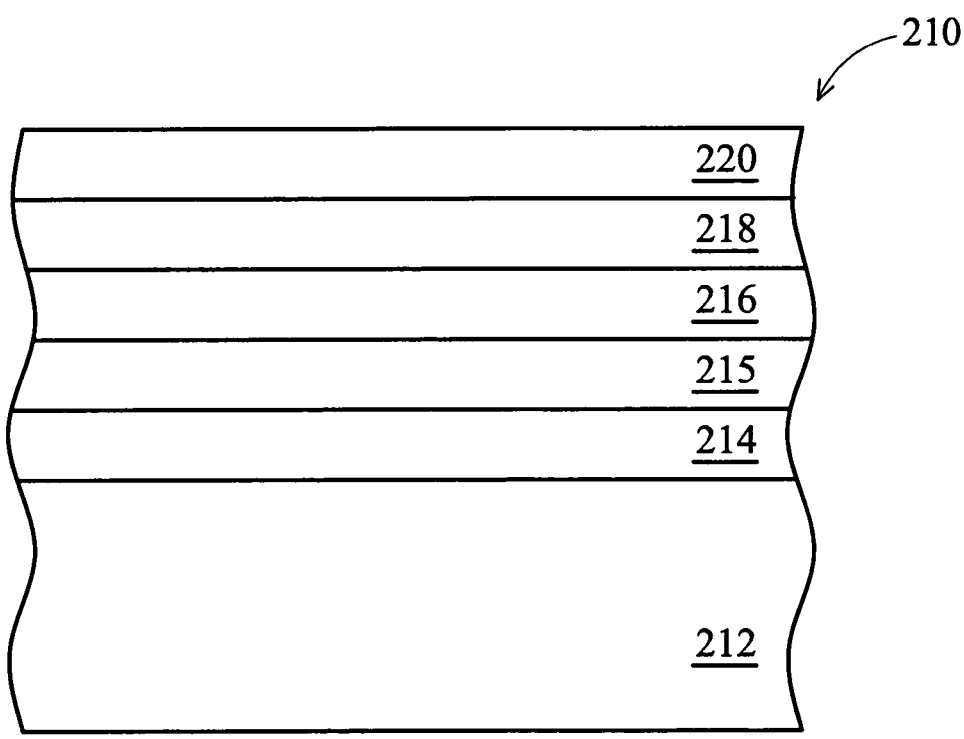
FIG. 4 is a cross-section of a second embodiment of a non-volatile memory according to the invention.

An embodiment of the non-volatile memory further comprises a buffer layer deposited between the dielectric layer and the bottom electrode layer. FIG. 4 is a cross-section of a second embodiment of the non-volatile memory 210 of the invention. As shown in FIG. 4, the non-volatile memory 210 is similar to the non-volatile memory 110 except for an additional buffer layer 215 between the dielectric layer 214 and the bottom electrode layer 216. Other structures are formed by the same materials and methods as those in the non-volatile memory 110, disclosed previously, such that only the fabrication method of the buffer layer 215 is described herein.

In this embodiment, after the dielectric layer is completed, radio-frequency magnetron sputtering forms a SrTiO₃ film as the buffer layer 215 at a thickness of about 20 to 100 nm. A similar procedure can form the bottom electrode 216, which tends to have the same crystal orientation as the buffer layer 215. Thus, the crystal orientation of the bottom electrode 216 is designed more easily. For example, due to physical properties, the LaNiO₃ film with a crystal orientation (110) is difficult to form directly. However, if a buffer layer 215 with a crystal orientation (110) has been formed previously, the LaNiO₃ film with the crystal orientation (110) can be formed more easily thereon. In other words, the crystal orientation can be controlled more easily, thereby improving electrical performance.

Figure 5:
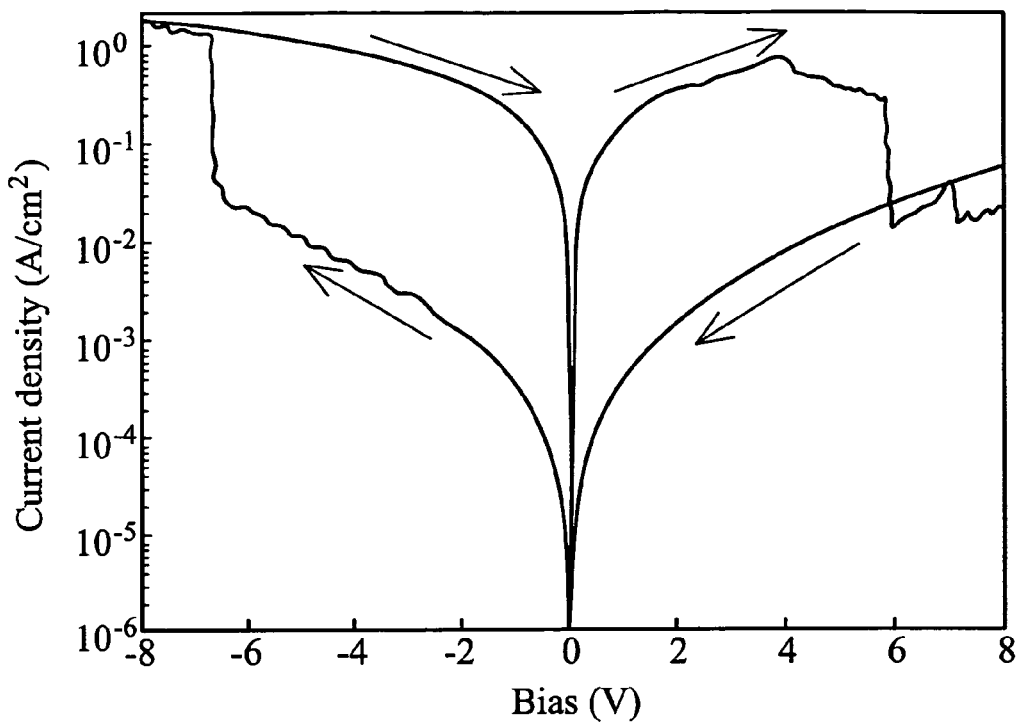
FIG. 5 shows the relationship between a bias and current density in an embodiment of a resistive non-volatile memory according to the invention.

FIG. 5 shows the relationship between a bias and current density in an embodiment of a resistive non-volatile memory of the invention. As shown, current density can vary in a $10^3$ order, and switch at bias about −7 V or +6 V. In positive biases, current density increases with bias, then drops sharply at +6 V. In negative biases, current density increases with bias, rising sharply at −7 V. It is obvious that two different resistances (due to the different order of the current density) can be distinguished clearly to meet the requirements of the resistive non-volatile memory.

Figure 6:
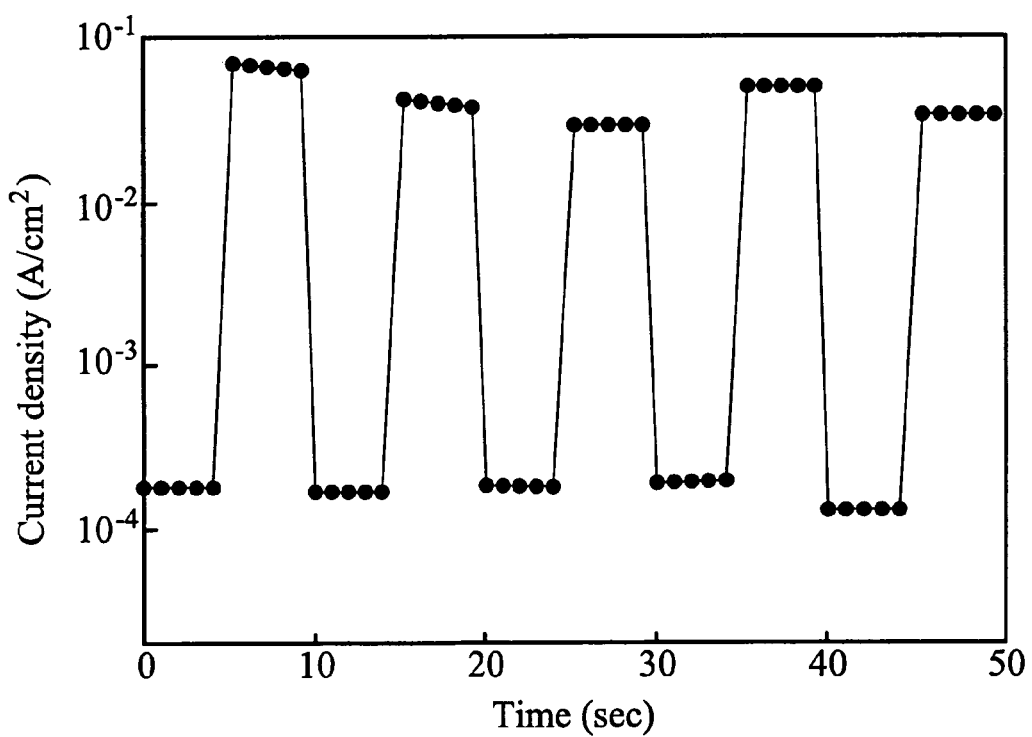
FIG. 6 shows the relationship between current density and time in an embodiment of a resistive non-volatile memory according to the invention.

FIG. 6 shows a relationship between current density and time in an embodiment of a resistive non-volatile memory in the invention. This experimental result is obtained by applying a pulse with a period of 500 μsec and amplitude of 15 V to the resistive non-volatile memory. The readout voltage is −2 V. As shown in FIG. 6, it is obvious that the non-volatile memory can switch resistance in a very short time and vary a current density in $10^3$ order, fully meeting the requirement for high-speed write and erase performance in resistive non-volatile memory.

The invention provides a method of forming the resistor layer of the non-volatile memory by sol-gel method, providing easy and short preparation, similar solution compositions to the dried film compositions, easy preparation for high precursor concentration, and lower fabrication cost. Solutions by conventional preparation cannot be used for a long time, whereas the solution according to the invention can still be used a month after preparation. Moreover, the film with larger area can be formed by sol-gel method according to the invention, accommodating non-volatile memory for mass productions. Additionally, low-cost and high-performance LaNiO₃ is used as bottom electrode, resulting in lowered fabrication costs. The resistive non-volatile memory according to the invention provides low operating voltage, high operating speed, high resistance ratio, non-destructive readout, long retention time, simple structure, and improved electric performance.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A method for non-volatile memory fabrication, comprising:
   providing a substrate;
   forming a bottom electrode on the substrate;

coating a solution with precursors containing Zr and Sr on the bottom electrode, wherein the solution with precursors containing Zr and Sr is prepared by:
  providing a first solvent in a container;
  adding an metallorganic compound of Sr into the container to mix with the first solvent to form a first solution;
  adding a second solvent to the first solution; and
  adding an metallorganic compound of Zr other than the second solvent to the first solution to form the solution;
heating the solution on the bottom electrode surface to form a resistor layer of $SrZrO_3$; and
forming a top electrode on the resistor layer.

2. The method of claim 1, wherein the resistor layer has a thickness of about 20 to 500 nm.

3. The method of claim 1, wherein the solution on the bottom electrode surface is dried in a high-temperature furnace.

4. The method of claim 1, further comprising forming a buffer layer on the substrate before forming the bottom electrode, wherein the buffer layer having a crystal orientation and the bottom electrode formed thereon having the same crystal orientation as the buffer layer.

5. The method of claim 4, wherein the bottom electrode has a crystal orientation comprising (100), (200), or (110).

6. The method of claim 4, wherein the buffer layer comprises $SrTiO_3$ and the bottom electrode comprises $LaNiO_3$.

7. The method of claim 1,, further comprising forming a dielectric layer on the substrate before forming the bottom electrode.

8. The method of claim 7, wherein the dielectric layer has a thickness of about 100 to 500 nm.

9. The method of claim 1, wherein the metallorganic compound of Sr comprises strontium acetate.

10. The method of claim 1, wherein the metallorganic compound of Zr comprises zirconium n-propoxide.

11. The method of claim 1, wherein the container is filled with inert gas.

12. The method of claim 1, wherein the first solvent is selected from a group of acetic acid, propionic acid, butyric acid, or combinations thereof.

13. The method of claim 1, wherein the second solvent is selected from a group of acetylacetone, ethylene glycol, isopropyl alcohol, n-propyl alcohol, or combinations thereof.

14. The method of claim 1, wherein the first solvent comprises acetic acid, and the second solvent comprises acetylacetone.

15. The method of claim 14, wherein acetic acid and acetylacetone have a volume ratio of about 1:1.

16. The method of claim 1, further comprising adding a dopant to the first solution.

17. The method of claim 16, wherein the dopant is selected from a group of V, Fe, Nb, Mn, Cr, Mo, or combinations thereof, and the dopant has a concentration of about 0.05 to 1 mol %.

18. The method of claim 1, further comprising a first heating of the first solvent after providing the first solvent into the container.

19. The method of claim 18, wherein the first heating is performed in a range of 60 to 120° C. for a time period in a range of 1 minute to 12 hours.

20. The method of claim 1, further comprising a second heating and a second stirring of the first solution after adding the metallorganic compound of Sr to the container.

21. The method of claim 20, wherein the second heating is performed in a range of 60 to 120° C., and the second stirring is performed for a time period in a range of 10 minutes to 12 hours.

22. The method of claim 1, further comprising a third heating and a third stirring of the solution after adding the metallorganic compound of Zr to the container.

23. The method of claim 22, wherein the third heating is performed in a range of 60 to 120° C., and the third stirring is performed for a time period in a range of 10 minutes to 24 hours.

* * * * *